(12) United States Patent
Saito et al.

(10) Patent No.: US 7,364,956 B2
(45) Date of Patent: Apr. 29, 2008

(54) METHOD FOR MANUFACTURING SEMICONDUCTOR DEVICES

(75) Inventors: Go Saito, Hikari (JP); Toshiaki Nishida, Kudamatsu (JP); Takahiro Shimomura, Kudamatsu (JP); Takao Arase, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 41 days.

(21) Appl. No.: 11/209,653

(22) Filed: Aug. 24, 2005

(65) Prior Publication Data

US 2007/0026611 A1 Feb. 1, 2007

(30) Foreign Application Priority Data

Jul. 26, 2005 (JP) ............................. 2005-216084

(51) Int. Cl.
*H01L 21/336* (2006.01)
(52) U.S. Cl. ...................... 438/197; 438/261; 438/710; 438/722; 257/E21.311
(58) Field of Classification Search ................ 438/585, 438/591, 689, 709, 711, 722, 142, 197, 238, 438/240, 261, 710; 257/E21.006, E21.311
See application file for complete search history.

(56) References Cited

U.S. PATENT DOCUMENTS

2005/0215062 A1* 9/2005 Miyagawa et al. ......... 438/706

FOREIGN PATENT DOCUMENTS

| JP | 05-160084 | 6/1993 |
|---|---|---|
| JP | 5-160084 | 6/1993 |
| JP | 2000-091321 | 3/2000 |
| JP | 2000-091325 | 3/2000 |
| JP | 2001015479 A * | 1/2001 |
| JP | 2003-318371 | 11/2003 |

\* cited by examiner

*Primary Examiner*—Brook Kebede
(74) *Attorney, Agent, or Firm*—Antonelli, Terry, Stout & Kraus, LLP.

(57) ABSTRACT

A method for manufacturing semiconductor devices includes a step of etching a sample including an interlayer insulating layer containing $Al_2O_3$ and a polysilicon or $SiO_2$ layer in contact with the interlayer insulating layer using a plasma etching system. The interlayer insulating layer is etched with a gas mixture containing $BCl_3$, Ar, and $CH_4$ or He. The gas mixture further contains $Cl_2$. The interlayer insulating layer is etched in such a manner that a time-modulated high-frequency bias voltage is applied to the sample. The interlayer insulating layer is etched in such a manner that the sample is maintained at a temperature of 100° C. to 200° C. The interlayer insulating layer and the polysilicon or $SiO_2$ layer are separately etched in different chambers.

4 Claims, 4 Drawing Sheets

SECTIONAL VIEWS A    SECTIONAL VIEWS B

METHOD FOR MANUFACTURING SEMICONDUCTOR DEVICES

The present application is based on and claims priority of Japanese patent application No. 2005-216084 filed on Jul. 26, 2005, the entire contents of which are hereby incorporated by reference.

BACKGROUND OF THE INVENTION

1. Field of the Invention

The present invention relates to a method for manufacturing semiconductor devices including alumina ($Al_2O_3$) layers and polysilicon or silicon dioxide ($SiO_2$) layers placed thereunder. The method includes steps of selectively processing these layers.

2. Description of the Related Art $Al_2O_3$ that is a high-K material is used to manufacture fine semiconductor devices. In particular, $Al_2O_3$ is used to form insulating layers placed between control gates and floating gates included in flash devices. The two types of gates are made of polysilicon and isolated from each other. In order to manufacture the flash devices, polysilicon layers for forming the control and floating gates and the $Al_2O_3$ insulating layers are selectively etched because there are steps due to the floating gates and isolation.

Known insulating layers placed between the control gates and the floating gates have an oxide-nitride-oxide (ONO) structure and are etched with CF gas. Since high-integrated, high-speed devices have been demanded, insulating layers having a high dielectric constant are necessary; hence, a high-K material is used to form such insulating layers.

With reference to FIG. 4, a wafer (sample) for manufacturing flash devices includes a silicon substrate 206 having isolation trenches 207 filled with $SiO_2$; base insulating layers 205, arranged on the silicon substrate 206, containing $SiO_2$; first polysilicon layers 204, each placed on the corresponding base insulating layers 205, for forming floating gates; an interlayer insulating layer 203, placed over the first polysilicon layers 204, containing $Al_2O_3$; a second polysilicon layer 202, placed on the interlayer insulating layer 203, for forming control gates; and a hard mask 201 placed on the second polysilicon layer 202. The floating gates are formed in such a manner that the first polysilicon layers 204 are etched such that the isolation trenches 207 and the base insulating layers 205 are exposed.

As shown in a sectional view taken along the line A-A in FIG. 4, portions of the second polysilicon layer 202 each make contact with corresponding sections of the interlayer insulating layer 203 that are located on the isolation trenches 207. As shown in a sectional view taken along the line B-B in FIG. 4, other portions of the second polysilicon layer 202 each make contact with corresponding sections of the interlayer insulating layer 203 that lie over the base insulating layers 205 and the first polysilicon layers 204.

Therefore, the second polysilicon layer 202 and the interlayer insulating layer 203 containing $Al_2O_3$ must be selectively etched as shown in the sectional view taken along the line B-B.

For example, Japanese Unexamined Patent Application Publication No. 5-160084 discloses that gas containing $BCl_3$ is used to remove alumina deposits from contact holes.

Furthermore, Japanese Unexamined Patent Application Publication No. 2003-318371 discloses that PZT is etched with $BCl_3$ or Ar at high temperature such that the selectivity of a hard mask is increased.

$Al_2O_3$ is usually etched with gas containing $Cl_2$ or $BCl_3$. However, such gas has low selectivity for polysilicon and $SiO_2$. Therefore, if the gas is used, the following problem occurs: a problem that the first polysilicon layers 204 and the base insulating layers (gate oxide layers) 205 placed thereunder are etched during the removal of $Al_2O_3$ present around steps.

SUMMARY OF THE INVENTION

It is an object of the present invention to provide a technique for selectively etching $Al_2O_3$, polysilicon, or $SiO_2$.

In order to achieve the above object, a method for manufacturing semiconductor devices including $Al_2O_3$ layers and polysilicon or $SiO_2$ layers placed thereunder according to the present invention includes a step of the $Al_2O_3$ layers with a gas mixture containing $BCl_3$, Ar, and $CH_4$ or He.

In the method of the present invention, the gas mixture may further contain $Cl_2$ or may contain He instead of Ar.

In the etching step, a time-modulated bias voltage may be applied to the $Al_2O_3$ layers. The $Al_2O_3$ layers may be etched at a high temperature of 100° C. to 200° C. The $Al_2O_3$ layers and the polysilicon or $SiO_2$ layers may be separately etched in different chambers.

In order to achieve the above object, a method for manufacturing semiconductor devices according to the present invention includes a step of etching a sample including an interlayer insulating layer containing $Al_2O_3$ and a polysilicon or $SiO_2$ layer in contact with the interlayer insulating layer using a plasma etching system. The interlayer insulating layer is etched with a gas mixture containing $BCl_3$, Ar, and $CH_4$ or He. In the method, the gas mixture may further contain $Cl_2$.

In this method of the present invention, the interlayer insulating layer may be etched in such a manner that a time-modulated high-frequency bias voltage is applied to the sample. Alternatively, the interlayer insulating layer may be etched in such a manner that the sample is maintained at a temperature of 100° C. to 200° C. The interlayer insulating layer and the polysilicon or $SiO_2$ layer may be separately etched in different chambers.

According to the present invention, since the interlayer insulating layer containing $Al_2O_3$ is etched with the gas mixture containing $BCl_3$, Ar, and $CH_4$, the interlayer insulating layer can be partly removed such that most of the polysilicon or $SiO_2$ layer remains.

Since the gas mixture is used to etch the interlayer insulating layer, a large amount of deposits are formed on walls of the etched interlayer insulating layer and the walls are likely to be tapered. However, the amount of the deposits can be reduced and the shape of the etched interlayer insulating layer can be improved without sacrificing the etching selectivity of $Al_2O_3$ to polysilicon or $SiO_2$ in such a manner that the sample is maintained at high temperature.

DESCRIPTION OF THE PREFERRED EMBODIMENTS

Figure 1:
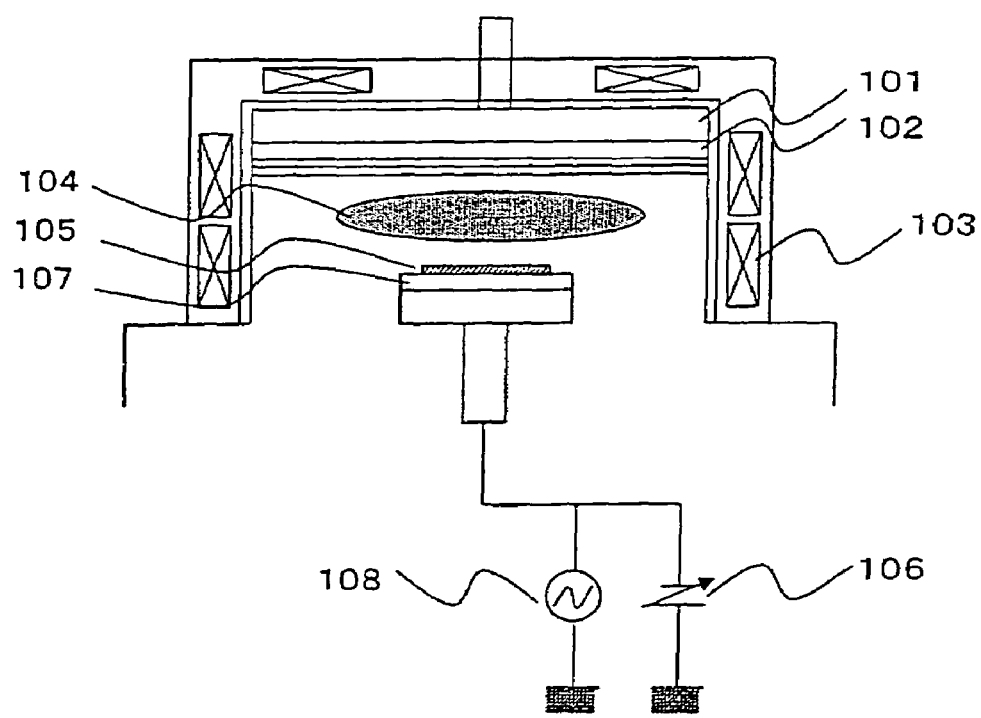
FIG. 1 is a schematic view showing a configuration of a plasma etching system suitable for a method according to the present invention.

The present invention provides a method for manufacturing semiconductor devices by etching a sample including an $Al_2O_3$ interlayer insulating layer and polysilicon or $SiO_2$ layers in contact with the $Al_2O_3$ interlayer insulating layer using a plasma etching system and a gas mixture containing $BCl_3$, Ar, and $CH_4$ or He.

The method according to the present invention will now be described. A plasma-generating section included in the plasma etching system is described in detail with reference to FIG. 1. In order to generate plasma, UHF waves and a magnetic field are used. The UHF waves are transmitted from a UHF power supply and reach an etching chamber through an antenna 101 and then a UHF wave-transmitting plate 102. The resulting UHF waves induce electron cyclotron resonance (ECR) under the action of the magnetic field generated from a solenoid coil 103 surrounding the etching chamber, thereby generating high-density plasma from process gas in the etching chamber.

After the high-density plasma is generated, a wafer (sample) 105 to be processed is provided on an etching table 107 to which a direct voltage is applied from an electrostatic attraction power supply 108, whereby the wafer 105 is electrostatically attracted onto the etching table 107. The etching table 107 is connected to a high-frequency power supply 106. Voltages are applied to ions present in the high-density plasma by applying a high-frequency bias voltage to the etching table 107 from the high-frequency power supply 106 such that the resulting ions are accelerated downward, that is, toward the wafer, whereby etching is started.

During etching, the pressure in the etching chamber can be controlled with an evacuation unit including a vacuum pump, a turbomolecular pump, and a variable valve placed between the turbomolecular pump and the etching chamber.

Figure 2A:
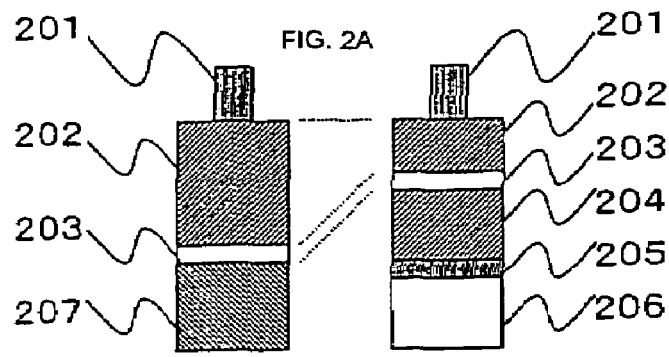
FIG. 2 includes sectional views showing steps included in the method of the present invention.
Figure 4:
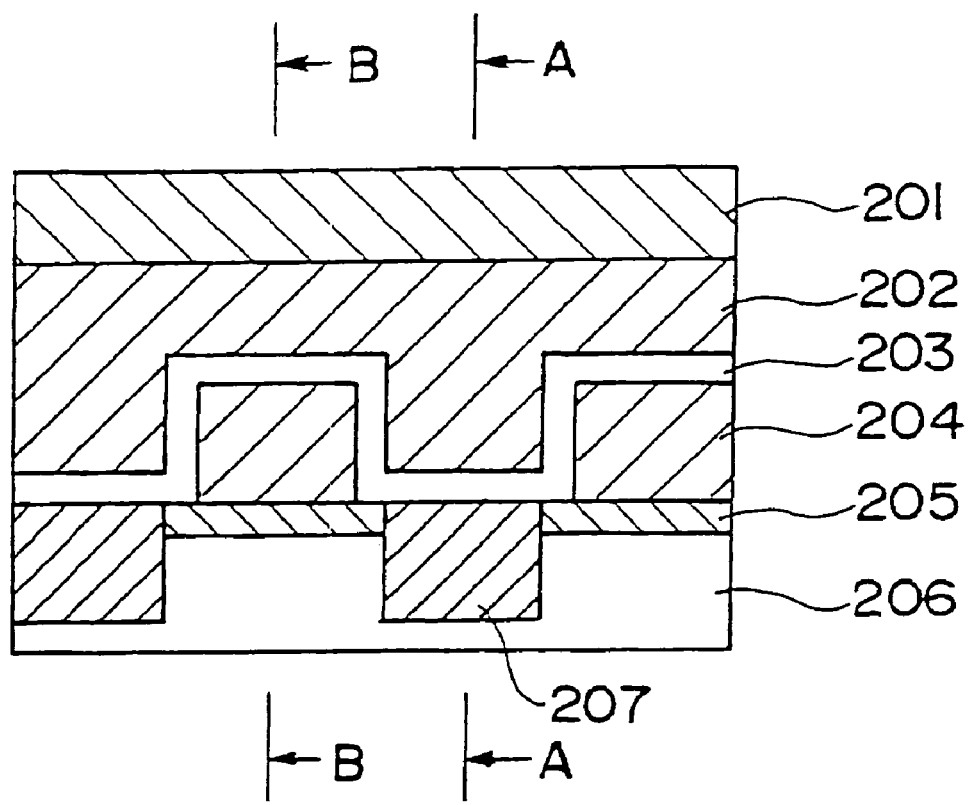
FIG. 4 is a sectional view showing a configuration of a wafer, including an interlayer insulating layer containing alumina, for manufacturing flash devices.

The method according to the present invention is further described with reference to FIG. 2. FIG. 2 is an illustration showing steps of processing the wafer 105. FIG. 2 includes sectional views A, arranged in the left column, taken along the line A-A of FIG. 4 and sectional views B, arranged in the right column, taken along the line B-B of FIG. 4. The wafer 105, shown in FIG. 4, to be etched includes a patterned hard mask 201; a second polysilicon layer 202 for forming control gates; an interlayer insulating layer 203 containing $Al_2O_3$; first polysilicon layers 204 for forming floating gates; a base insulating layers 205 containing $SiO_2$; and a silicon substrate 206 having isolation trenches 207 filled with, for example, $SiO_2$ as shown in FIG. 2A, these components being arranged in that order from the top.

Figure 2B:
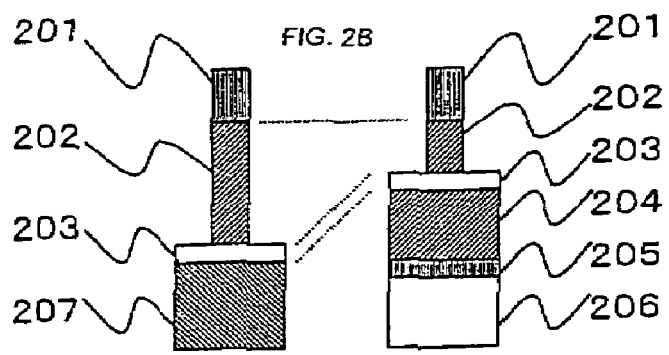

As shown in FIG. 2B, the second polysilicon layer 202 is etched through the hard mask 201 with the plasma etching system shown in FIG. 1 using a gas mixture containing $Cl_2$, HBr, and $O_2$. Portions of the second polysilicon layer 202 have a small thickness as shown in sectional views B but other portions of the second polysilicon layer 202 have a large thickness as shown in sectional views A. Therefore, the second polysilicon layer 202 must be etched more selectively as compared to the interlayer insulating layer 203.

Figure 2C:
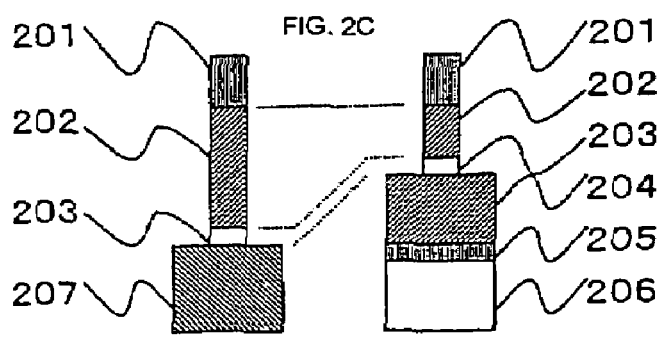

As shown in FIG. 2C, the interlayer insulating layer 203 is etched using a gas mixture containing $BCl_3$, $CH_4$, and Ar. In this step, the etching selectivity of $Al_2O_3$ must be greater than that of polysilicon or $SiO_2$.

Figure 2D:
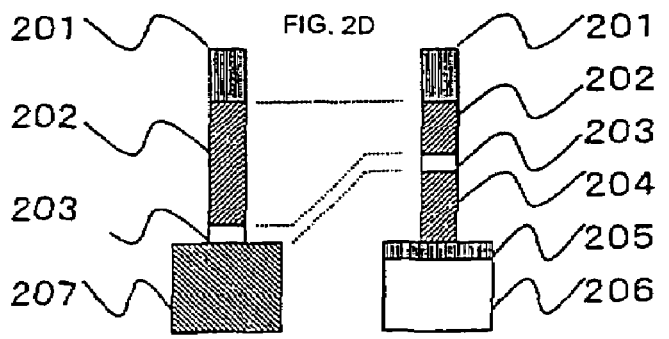

As shown in FIG. 2D, the first polysilicon layers 204 are etched a gas mixture containing $Cl_2$, HBr, and $O_2$ and then overetched using a gas mixture containing HBr and $O_2$.

In the step shown in FIG. 2C, $BCl_3$ is used such that Al atoms are etched off with chlorine ($Cl_2$) and the Al—O bond of $Al_2O_3$ is broken with B.

When only $BCl_3$ is used, the etching rate of polysilicon is two times that of $Al_2O_3$ and is 1.5 times that of $SiO_2$.

When etching is performed at a pressure of 0.8 Pa using a gas mixture containing 30% of $BCl_3$ and 70% of Ar, the etching rate of $Al_2O_3$ is 29.8 nm/min, that of polysilicon is 44.9 nm/min, and that of $SiO_2$ is 37.3 nm/min.

In the method of the present invention, a gas mixture containing $BCl_3$, Ar, and $CH_4$ is used. This gas mixture has, for example, a $BCl_3$ content of 30%, an Ar content of 66%, and a $CH_4$ content of 4%. Since this gas mixture contains Ar and $CH_4$ in addition to $BCl_3$, the etching rates of $Al_2O_3$, polysilicon, and $SiO_2$ are reduced. However, a decrease in the etching rate of polysilicon is greater than a decrease in the etching rate of $Al_2O_3$, that is, the etching selectivity of $Al_2O_3$ is higher than that of polysilicon.

Figure 3:
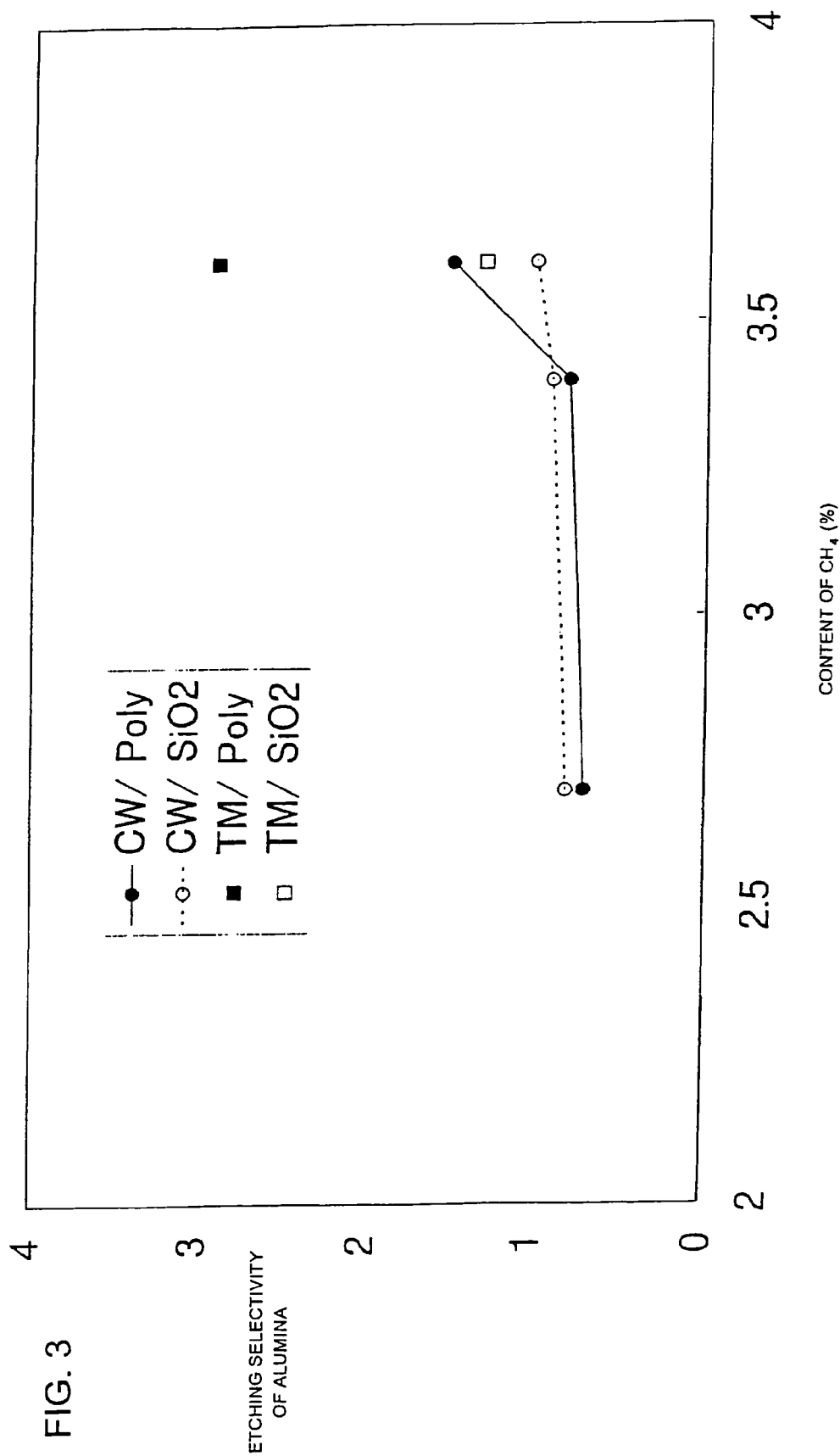
FIG. 3 is a graph showing the relationship between the content of $CH_4$ in an etching gas used in the method of the present invention and the etching selectivity of alumina and also showing the effects of time-modulated bias voltages.

FIG. 3 is a graph showing the relationship between the content of $CH_4$ in an etching gas and the etching selectivity of $Al_2O_3$ to polysilicon or $SiO_2$.

With reference to FIG. 3, when the content of $BCl_3$ in the etching gas is 30% and the content of $CH_4$ is 2.7%, 3.4%, or 3.6%, the etching selectivity of $Al_2O_3$ to polysilicon is 0.7, 0.8, or 1.5, respectively, and the etching selectivity of $Al_2O_3$ to $SiO_2$ is 0.8, 0.9, or 1.0, respectively.

When the $CH_4$ content is 3.6%, the etching selectivity of $Al_2O_3$ to polysilicon is high and is substantially equal to the etching selectivity of $Al_2O_3$ to $SiO_2$. That is, when the $CH_4$ content is increased 2.7% to 3.6%, the etching selectivity of $Al_2O_3$ to polysilicon or $SiO_2$ is increased.

The etching selectivity of $Al_2O_3$ to polysilicon and that to $SiO_2$ can be increased by applying a time-modulated RF bias voltage to a sample. Conditions for applying such a voltage to the sample are as follows: a bias frequency of 400 kHz, an output of 50 W, an application time of $5 \times 10^{-4}$ second, and a non-application time of $5 \times 10^{-4}$ second. A bias voltage that is not time-modulated is continuously applied to the sample.

As is clear from FIG. 3, in the case that the $CH_4$ content is 3.6% and a RF bias voltage is used under the above conditions, the etching selectivity of $Al_2O_3$ to polysilicon is 2.9 or 1.5 when a time-modulated RF bias voltage or a non-time-modulated RF bias voltage, respectively, is used. Furthermore, the etching selectivity of $Al_2O_3$ to $SiO_2$ is 1.3 or 1.0 when the RF bias voltage is time-modulated or not time-modulated, respectively. That is, the etching selectivity of $Al_2O_3$ to polysilicon or $SiO_2$ can be greatly increased using such a time-modulated RF bias voltage.

When etching is performed under the above conditions, a large amount of hydrocarbons are deposited on walls of etched portions; hence the etched portions have a tapered shape. This can cause problems in subsequent etching steps. Such problems due to the shape of the etched portions can be solved without sacrificing the etching selectivity in such a manner that the amount of such hydrocarbon deposits is reduced by etching a wafer at high temperature, whereby the wafer can be vertically etched.

The effect of temperature on the shape of etched portions will now be described. When the temperature of the wafer is 50° C. or 150° C., the etching selectivity of $Al_2O_3$ to polysilicon is 0.8 or 1.0, respectively, and the etching selectivity of $Al_2O_3$ to $SiO_2$ is 0.8 or 0.9, respectively. When the wafer temperature is 50° C., the tilt angle is 50 degrees. On the other hand, when the wafer temperature is 150° C., the tilt angle is substantially square, 88 degrees. Accordingly, the tilt angle can be maintained substantially square without sacrificing the etching selectivity of $Al_2O_3$ to polysilicon or $SiO_2$ in such a manner that the wafer temperature is maintained at 150° C. during etching.

As described above, although the second polysilicon layer 202 and the first polysilicon layers 204 may be etched at a low temperature of 50° C. or a high temperature of 100° C. to 200° C., the interlayer insulating layer 203 is preferably etched at a high temperature of 100° C. to 200° C. in order to maintain the tilt angle square. Therefore, the first and second polysilicon layers 204 and 202 and the interlayer insulating layer 203 are preferably etched separately in different chambers, whereby satisfactory etching results can be achieved.

What is claimed is:

1. A method for manufacturing semiconductor devices comprising:

a step of etching a sample including an interlayer insulating layer containing $Al_2O_3$ and a polysilicon or $SiO_2$ layer in contact with the interlayer insulating layer using a plasma etching system, wherein the interlayer insulating layer is etched with a gas mixture containing $BCl_3$, Ar, and $CH_4$ or He, wherein the interlayer insulating layer is etched in such a manner that the sample is maintained at a temperature of 100° C. to 200° C., and wherein the interlayer insulating layer and the polysilicon or $SiO_2$ layer are separately etched in different chambers.

2. The method according to claim 1, wherein in said step of etching the $Al_2O_3$ is selectively etched relative to etching of polysilicon and $SiO_2$.

3. The method according to claim 1, wherein the interlayer insulating layer is etched in such a manner that a time-modulated high-frequency bias voltage is applied to the sample.

4. The method according to claim 1, wherein the interlayer insulating layer is etched in such a manner that the sample is maintained at a temperature of 100° C. to 200° C.

* * * * *